(12) United States Patent
Pidin

(10) Patent No.: US 7,262,472 B2
(45) Date of Patent: Aug. 28, 2007

(54) SEMICONDUCTOR DEVICE HAVING STRESS AND ITS MANUFACTURE METHOD

(75) Inventor: Sergey Pidin, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 77 days.

(21) Appl. No.: 10/970,158

(22) Filed: Oct. 22, 2004

(65) Prior Publication Data

US 2005/0269650 A1 Dec. 8, 2005

(30) Foreign Application Priority Data

Jun. 8, 2004 (JP) ............................. 2004-170037

(51) Int. Cl.
*H01L 29/76* (2006.01)
(52) U.S. Cl. ................ 257/410; 257/510; 257/E27.015
(58) Field of Classification Search ................ 257/411, 257/410, 510, 374, 338, 351, E27.015, E27.017, 257/E27.109
See application file for complete search history.

(56) References Cited

U.S. PATENT DOCUMENTS

| | | | |
|---|---|---|---|
| 6,352,885 B1* | 3/2002 | Wieczorek et al. | 438/197 |
| 2005/0035470 A1* | 2/2005 | Ko et al. | 257/900 |
| 2005/0224867 A1* | 10/2005 | Huang et al. | 257/327 |
| 2005/0258515 A1* | 11/2005 | Chidambarrao et al. | 252/649 |

FOREIGN PATENT DOCUMENTS

| | | |
|---|---|---|
| JP | 2003-86708 | 3/2003 |
| JP | 2004-127957 | 4/2004 |

OTHER PUBLICATIONS

T. Ghani et al., A 90nm High Volume Manufacturing Logic Technology Featuring Novel 45nm Gate Length Strained Silicon CMOS Transistors, 2003 IEDM Technical Digest, pp. 978-980.

* cited by examiner

*Primary Examiner*—Howard Weiss
*Assistant Examiner*—(Vikki) Hoa B. Trinh
(74) *Attorney, Agent, or Firm*—Westerman, Hattori, Daniels & Adrian, LLP.

(57) ABSTRACT

A semiconductor device has: active regions including a p-type active region; an insulated gate electrode structure formed on each of the active regions, and having a gate insulating film and a gate electrode formed thereon; side wall spacers formed on side walls of the insulated gate electrode structures; source/drain regions having extension regions having the opposite conductivity type to that of the active region and formed on both sides of the insulated gate electrode structures and source/drain diffusion layers having the opposite conductivity type and formed in the active regions outside of the side wall spacers; first recess regions formed by digging down the n-type source/drain regions in the p-type active region from surfaces of the n-type source/drain regions; and a first nitride film having tensile stress formed covering the p-type active region and burying the first recess regions.

14 Claims, 9 Drawing Sheets

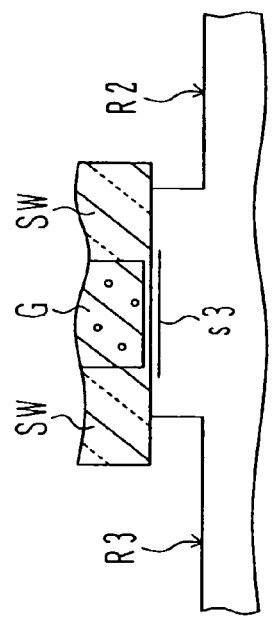
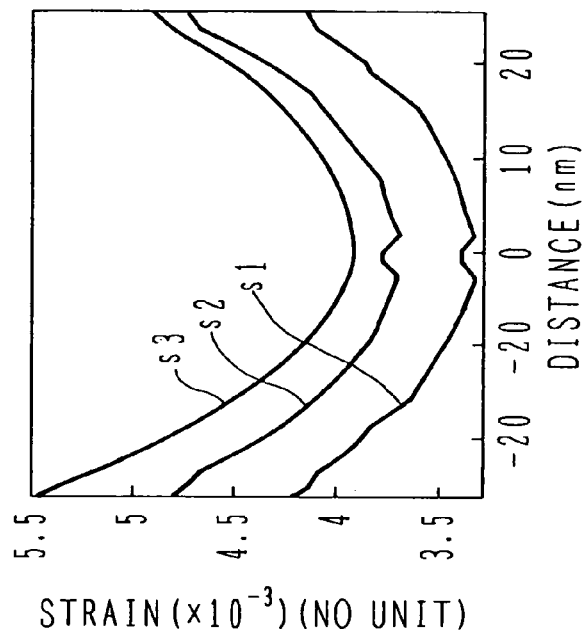
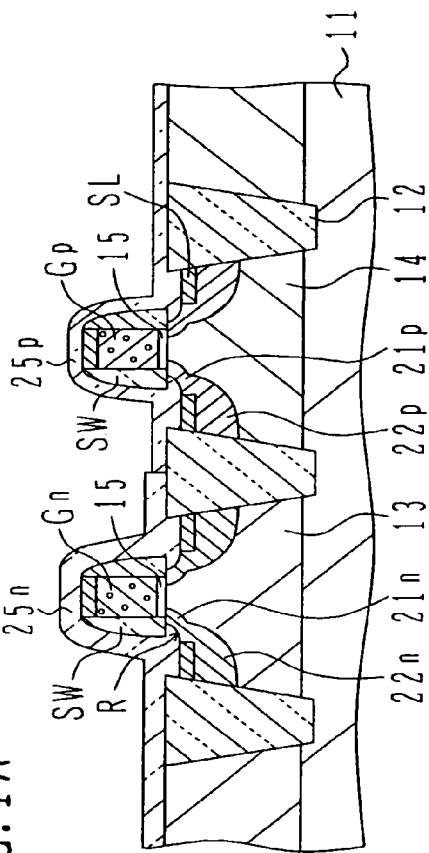
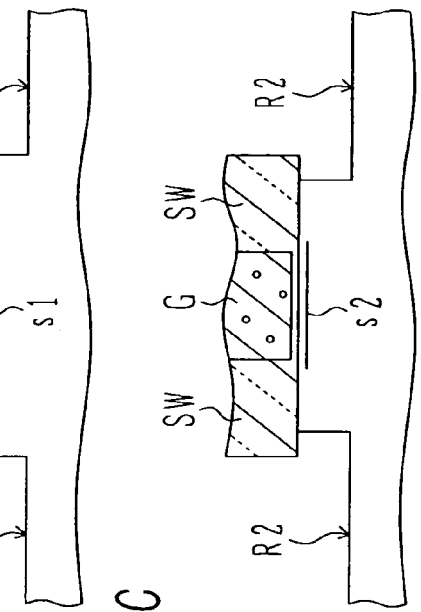

SEMICONDUCTOR DEVICE HAVING STRESS AND ITS MANUFACTURE METHOD

CROSS REFERENCE TO RELATED APPLICATION

This application is based on and claims priority of Japanese Patent Application No. 2004-170037 filed on Jun. 8, 2004, the entire contents of which are incorporated herein by reference.

BACKGROUND OF THE INVENTION

A) Field of the Invention

The present invention relates to a semiconductor device and its manufacture method, and more particularly to a semiconductor device having a nitride film on a semiconductor substrate as an etching stopper film and to its manufacture method.

B) Description of the Related Art

A mobility of charge carriers in semiconductor is influenced by stress. For example, a mobility of electrons in silicon increases as a tensile stress increases, whereas it decreases as the tensile stress decreases. Conversely, a mobility of holes in silicon increases as a compressive stress increases, whereas it decreases as the compressive stress decreases.

Manufacture processes for a semiconductor device include generally a contact hole forming process of forming a contact hole through an interlayer insulating film covering a MOS transistor and exposing a MOS transistor electrode area. In order to form a contact hole with good controllability, the interlayer insulating film is made of an etching stopper film and an insulating film formed thereon. A nitride film having a tensile stress is mainly used as the etching stopper film.

As integrated circuit devices are highly integrated, electronic elements as constituent elements such as metal oxide semiconductor (MOS) transistors are made fine. As the miniaturization degree becomes high, a residual stress in an etching stopper film and the like causes a distinctive influence upon the characteristics of an electronic element such as a MOS transistor. It has been reported that a current drive performance of a MOS transistor can be improved by thickening a nitride film having a tensile stress and used as an etching stopper film (T. Ghani et al., A 90 nm High Volume Manufacturing Logic Technology Featuring Novel 45 nm Gate Length Strained Silicon CMOS Transistors, 2003 IEDM Technical Digest, pp. 978-980).

As a nitride film used as an etching stopper film is thickened, it becomes difficult to control an etching process of forming a contact hole. In order to improve the characteristics of an n-channel MOS transistor without thickening a nitride film used as an etching stopper film, another means is desired to increase a stress to be applied to the channel region.

A general MOS transistor has side wall spacers on the side walls of an insulated gate electrode. An etching stopper film is deposited after the side wall spacers are formed. Namely, the side wall spacer exists between the etching stopper film and channel region. As the width of the side wall spacer is narrowed, it is expected that the etching stopper is positioned nearer to the channel region.

An increase in a tensile stress lowers the mobility of holes. In a CMOSFET integrated circuit, n- and p-channel MOSFETs are formed. As the tensile stress exerted by the etching stopper film on the channel region is increased, although the characteristics of the n-channel MOSFET are improved, the characteristics of the p-channel MOSFET are degraded.

Japanese Patent Laid-open Publication No. 2003-86708 has proposed to use a stress controlled film wherein an n-channel MOSFET is covered with a film having a tensile stress and a p-channel MOSFET is covered with a film having a compressive stress.

FIG. 5 is a schematic diagram showing the CMOS structure proposed in Japanese Patent Laid-open Publication No. 2003-86708. For example, an active region isolation trench is formed in a surface layer of a p-type silicon substrate 111, and an insulating film such as an oxide film is filled in the trench to form a shallow trench isolation (STI) region 112. Desired ions are implanted in active regions defined by the STI region 112 to form a p-type well 113 for an n-channel MOSFET and an n-type well 114 for a p-channel MOSFET. The surface of the active region is thermally oxidized to form a gate insulating film 115. After the gate insulating film is formed, a polysilicon layer is deposited to form a gate electrode layer. By using a resist pattern, the gate electrode layer and gate insulating film are patterned to form a gate electrode Gn and underlying gate insulating film 115 of the n-channel MOSFET and a gate electrode Gp and underlying gate insulating film 115 of the p-channel MOSFET. Desired ions are implanted into n- and p-channel MOSFET regions to form an n-type extension region 121n in the n-channel MOSFET region and a p-type extension region 121p in the p-channel MOSFET region.

Thereafter, an insulating film such as a silicon oxide film is deposited and anisotropic etching is performed to form side wall spacers SW on the side walls of the gate electrode. After the side wall spacers are formed, impurities of desired conductivity types are again implanted in the n- and p-channel MOSFET regions to form n-type source/drain diffusion layers 122n in the n-channel MOSFET region and p-type source/drain diffusion layers 122p in the p-channel MOSFET region.

Thereafter, a metal layer capable of silicidation such as cobalt is deposited to conduct a silicidation reaction, an unreacted metal layer is removed, and then the silicidation reaction is again conducted and completed to leave a silicide layer SL on the gate electrode G and source/drain regions 122. The n-channel MOSFET region is covered with an etching stopper layer 125n which is a nitride film having a tensile stress, and the p-channel MOSFET region is covered with an etching stopper layer 125p which is a nitride film having a compressive stress.

This structure can exert a tensile stress on the n-channel MOSFET region and a compressive stress on the p-channel MOSFET region. These stresses improve the characteristics of MOSFETs.

Japanese Patent Laid-open Publication No. 2004-127957 discloses the structure that the side wall spacer is made of a lamination of first and second insulating films, a retracted portion is formed on the first insulating film through selective etching, and after silicide regions are formed, an interlayer insulating film is formed by a lamination of a nitride film and an oxide film or the like.

SUMMARY OF THE INVENTION

An object of this invention is to provide a semiconductor device whose characteristics are improved by stress, and its manufacture method.

Another object of this invention is to provide a semiconductor device capable of increasing stress without thickening an etching stopper film and narrowing a side wall space width, and its manufacture method.

According to one aspect of the present invention, there is provided a semiconductor device comprising: a semiconductor substrate having a plurality of active regions including p-type active regions; an insulated gate electrode structure formed on each of the active regions, the insulated gate electrode structure having a gate insulating film and a gate electrode formed thereon; side wall spacers formed on side walls of each of the insulated gate electrode structures; source/drain regions having extension regions having a conductivity type opposite to a conductivity type of the active region and formed in the active regions on both sides of each of the insulated gate electrode structures and source/drain diffusion layers having the conductivity type opposite to the conductivity type of the active region and formed in the active regions outside of the side wall spacers; first recess regions formed by digging down the n-type source/drain regions in the p-type active region from surfaces of the n-type source/drain regions; and a first nitride film having a tensile stress formed covering the p-type active region and burying the first recess regions.

According to another aspect of the present invention, there is provided a semiconductor device manufacture method, comprising steps of: (a) preparing a semiconductor substrate having a plurality of active regions including p-type active regions; (b) forming an insulated gate electrode structure on each of the active regions, the insulated gate electrode structure having a gate insulating film and a gate electrode formed thereon; (c) implanting impurities of a conductivity type opposite to a conductivity type of the active region in the active regions on both sides of the insulated gate electrode structure to form extension regions; (d) forming side wall spacers on side walls of each of the insulated gate electrode structures; (e) digging the extension regions in the p-type active regions from surfaces of the extension regions to form first recesses; (f) implanting impurities of the conductivity type opposite to the conductivity type of the active region in the active regions outside of the insulated gate electrode structure and the side wall spacers to form source/drain layers; and (g) forming a first nitride film having a tensile stress, the nitride film covering the p-type active region and burying the first recess regions.

The source/drain regions on both sides of the gate electrode are dug from the surfaces thereof to form the recess regions, and the nitride film is formed burying the recess regions. Stress applied to the channel region can therefore be increased. The stress (strain) applied to the channel region can be increased without thickening the nitride film and without narrowing the side wall spacer width.

BRIEF DESCRIPTION OF THE DRAWINGS

FIGS. 1A to 1E are a cross sectional view of a semiconductor device according to a first embodiment of the invention, cross sectional views showing simulation models for verifying the characteristics of the semiconductor device, and a graph showing the simulation results.

DESCRIPTION OF THE PREFERRED EMBODIMENTS

Prior to the description of embodiments, preliminary experiments made by the present inventor will be described.

Figure 4A:
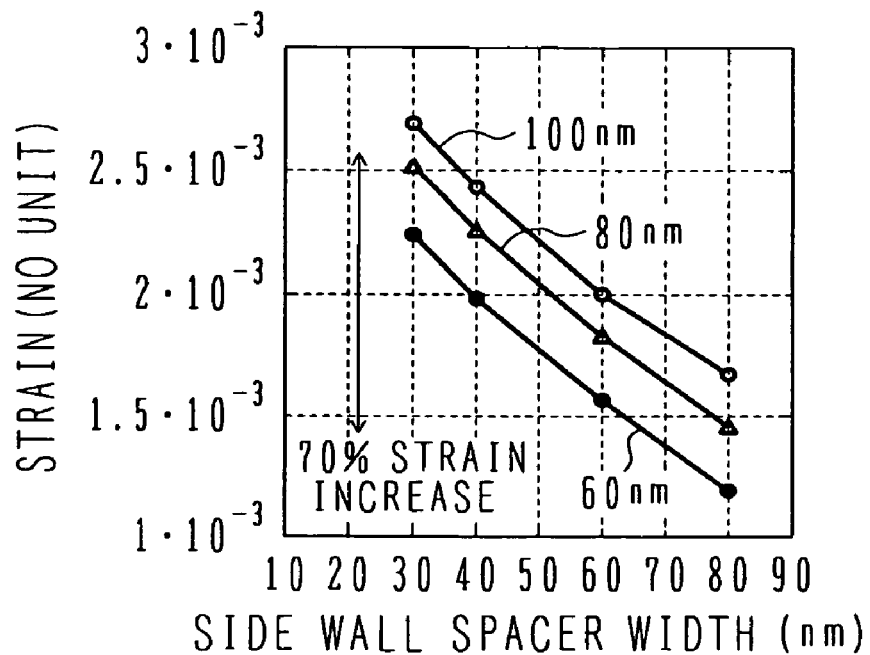
FIGS. 4A and 4B are graphs showing the results of preliminary experiments made by the present inventor.

FIG. 4A is a graph showing the measurement results of a change in a strain amount applied to the channel region relative to a change in a side wall spacer width. The abscissa represents a side wall spacer width and the ordinate represents strain (a ratio between sizes, no unit). The thicknesses of etching stopper films formed after the side wall spacers are formed were set to 60 nm, 80 nm and 100 nm. As the thickness of the etching stopper film is increased, strain increases. As the side wall spacer thickness is decreased, strain increases independently from the thickness of the etching stopper film. As the side wall spacer width is decreased from 80 nm to 30 nm, the strain amount applied to the central channel region increases by about 70%.

Figure 4B:
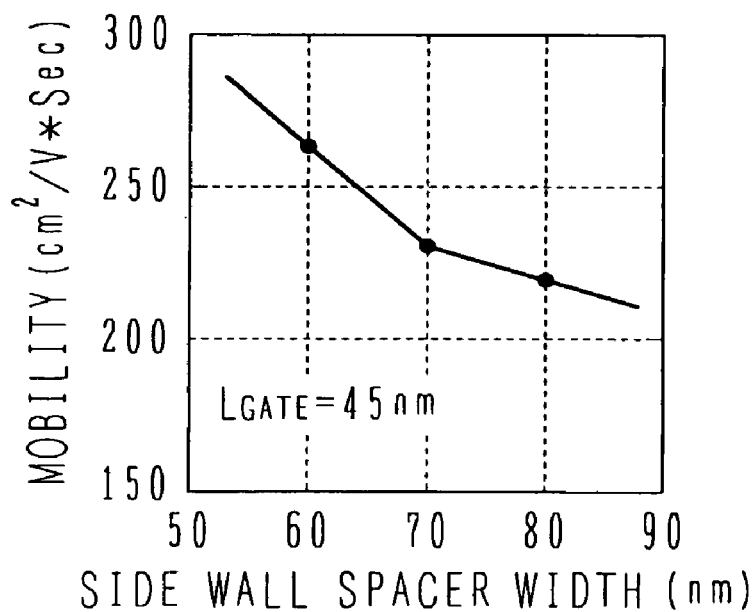
Figure 5:
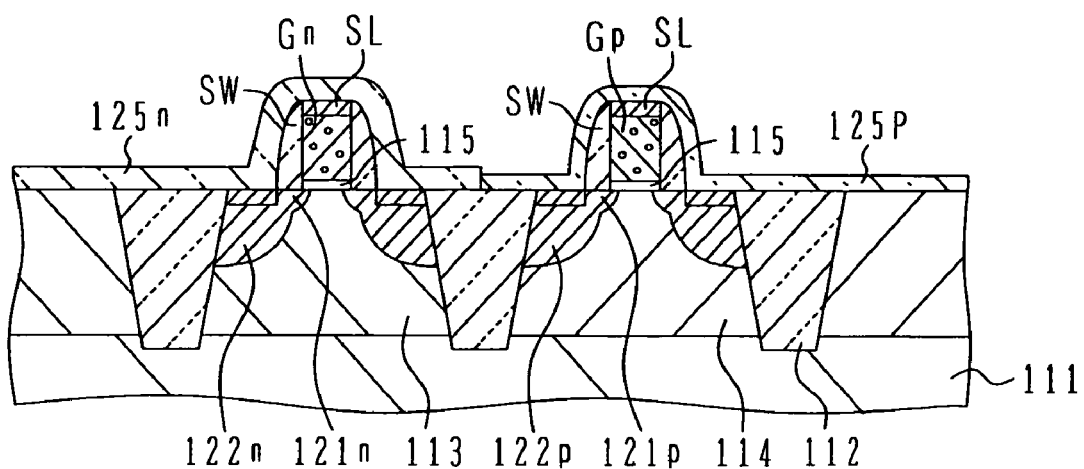
FIG. 5 is a cross sectional view of a semiconductor device according to conventional techniques.

FIG. 4B is a graph showing the measurement results of a mobility of electrons in an n-channel MOSFET wherein the side wall spacer width was changed and an etching stopper film made of a silicon nitride film having a high tensile stress was formed on the n-channel MOSFET region. The length of the gate electrode of the n-channel MOSFET is 45 nm. As the side wall spacer width decreases from 80 nm to 70 nm and to 60 nm, the mobility of electrons in the n-channel MOSFET increases from about 220 $cm^2$/V sec to about 230 $cm^2$N·sec and to about 265 $cm^2$/V·sec.

As the side wall spacer width is narrowed, the influence of the nitride film having a tensile stress upon the channel region can be increased and the mobility of electrons can be increased. However, as the side wall spacer width is broadened, the distance is shortened between the source/drain region diffusion layers formed by ion implantation after the side wall spacers are formed, resulting in an increase in the short channel effect.

Embodiments of the invention will be described with reference to the accompanying drawings.

FIG. 1A is a schematic cross sectional view showing the structure of a CMOS semiconductor device according to a first embodiment of the invention. A shallow trench as an element isolation region is formed in a surface layer of a p-type silicon substrate 11, and an insulating film such as an oxide film is filled in the trench to form a shallow trench isolation (STI) region 12.

Well forming impurities are implanted in active regions defined by the STI region 12 to form a p-type well 13 for an n-channel MOSFET and an n-type well 14 for a p-channel MOSFET. A gate insulating film 15 is formed on the surface of the active region, and a polysilicon layer as a gate electrode film is deposited on the gate insulating film. The polysilicon layer and gate insulating film are patterned to form an insulated gate electrode structure.

In the p-type well 13, n-type impurities are implanted shallowly to form an n-type extension region 21n, and in the n-type well 14, p-type impurities are implanted shallowly to form a p-type extension region 21p. Thereafter, an insulating film such as an oxide film is deposited on the whole surface of the substrate and anisotropically etched to form side wall spacers SW on the side walls of the insulated gate structures in both n- and p-channel MOSFET regions.

After the side wall spacers are formed, etching continues to dig the regions outside of the side wall spacers and form recess regions R. Isotropic etching may be performed thereafter to make the recess regions creep under the side wall spacers SW.

After the recess regions are formed, in the p-type well 13, n-type impurities are implanted deeply to form n-type source/drain diffusion layers 22n, and in the n-type well 14, p-type impurities are implanted deeply to form p-type source/drain layers 22p.

A metal layer such as cobalt is deposited on the exposed silicon surface to conduct a silicidation reaction and form silicide regions SL. Thereafter, in the p-type well 13, a nitride film 25n having a tensile stress is formed burying the recess regions, and in the n-type well, a nitride film 25p having a compressive stress is formed burying the recess regions.

How strain in the channel region changes by burying the recess regions with the nitride films was studied through simulation.

FIGS. 1B, 1C and 1D are schematic diagrams showing three simulation models. In FIG. 1B, the recesses R1 are formed by anisotropic etching of both regions outside of the side wall spacers SW. The recess regions do not creep under the side wall spacers SW. Strain in the channel region s1 was simulated. FIG. 1C shows the recess regions R2 having the regions creeping under the side wall spacers SW by 10 nm. Strain in the channel region s2 was simulated. FIG. 1D shows the recess regions R3 having the regions creeping under the side wall spacers SW by 20 nm. Strain in the channel region s3 was simulated.

FIG. 1E shows the simulation results. The abscissa represents a distance from the channel center in the unit of nm, and the ordinate represents strain. If the recesses are not formed, the strain is $3 \times 10^{-3}$ or smaller as shown in FIG. 4A. The simulation model shown in FIG. 1B having the recess regions R1 on both sides of the side wall spacers increased the strain to about $3.3 \times 10^{-3}$ or larger at the center of the channel region s1.

The simulation model shown in FIG. 1C having the recess regions R2 creeping under the side wall spacers by 10 nm increases the strain by about 30% of the model shown in FIG. 1B at the center of the channel region s2. The simulation model shown in FIG. 1D having the recess regions R3 creeping under the side wall spacers by 20 nm increases the strain further by about 20% at the center of the channel region s3. It is conceivable that strain increases by an amount corresponding to the creep distance under the side wall spacer.

It has been confirmed by simulation that strain in the channel region can be increased by forming the recess regions and burying the recess regions with the nitride film.

Figure 2A:
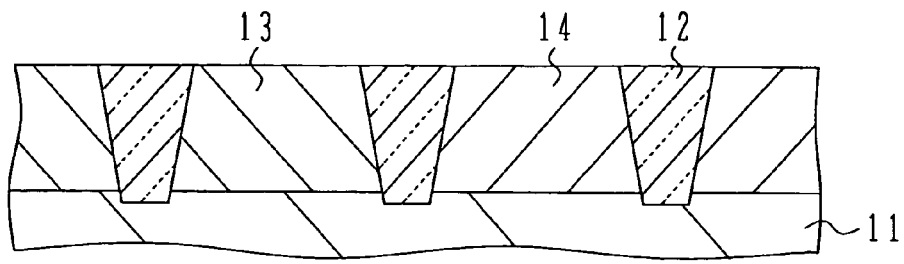
FIGS. 2A to 2P are cross sectional views illustrating a method of manufacturing the semiconductor device of the first embodiment.
Figure 2B:
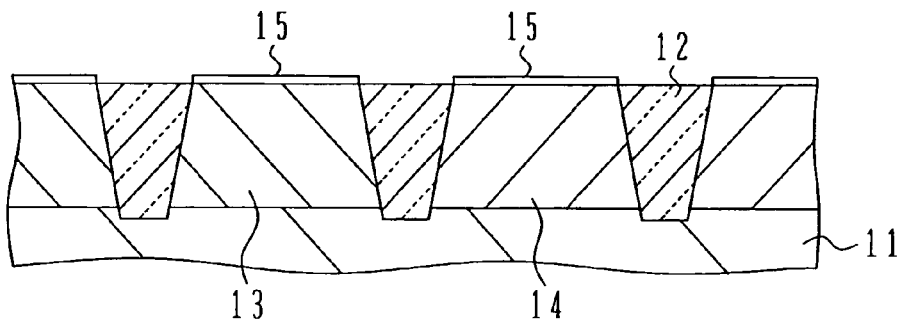
Figure 2C:
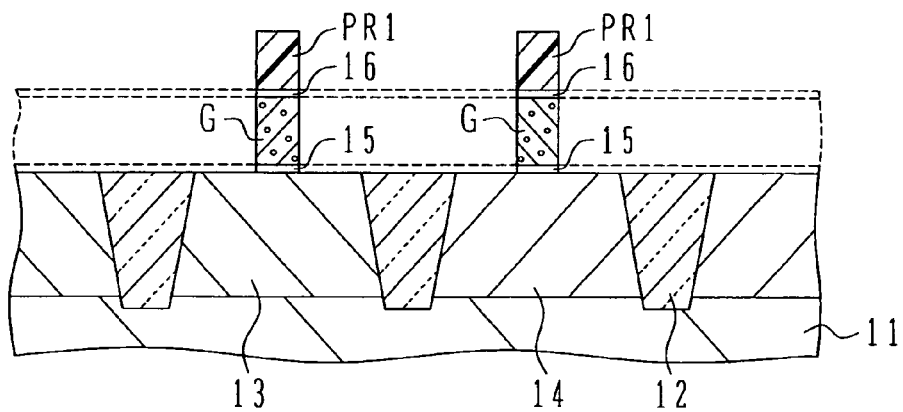
Figure 2D:
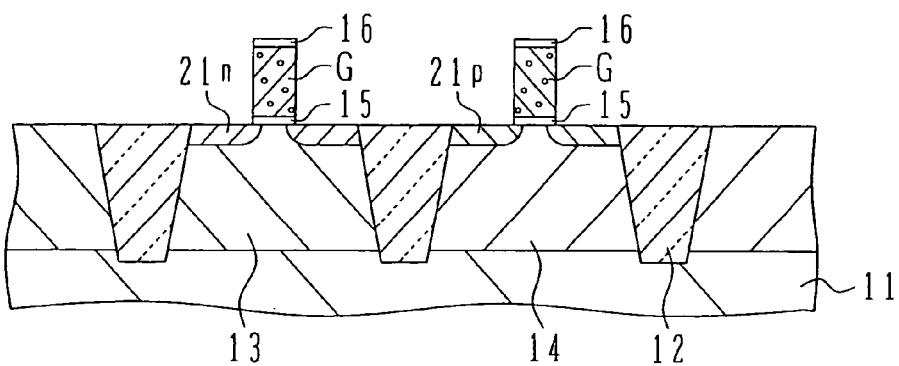
Figure 2E:
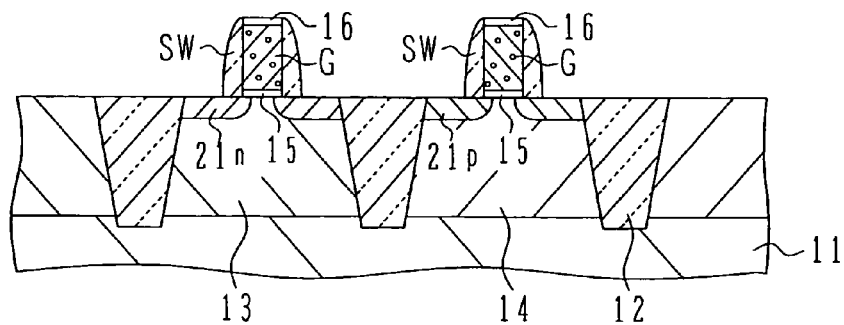
Figure 2F:
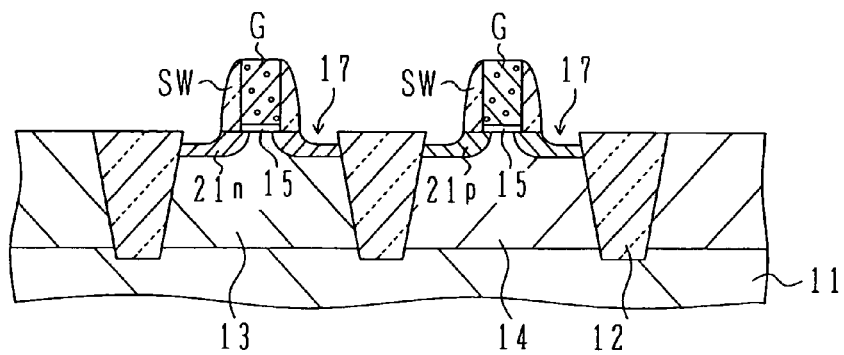
Figure 2G:
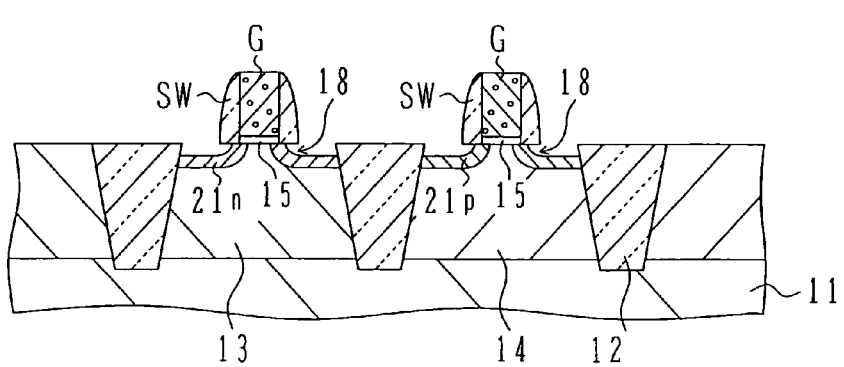
Figure 2H:
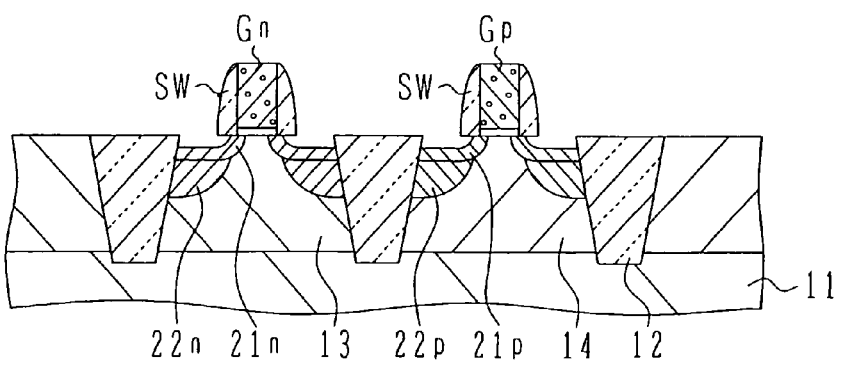
Figure 2I:
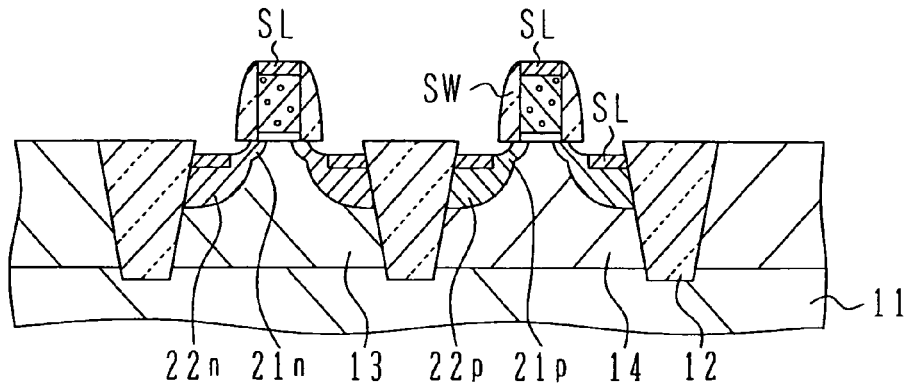
Figure 2J:
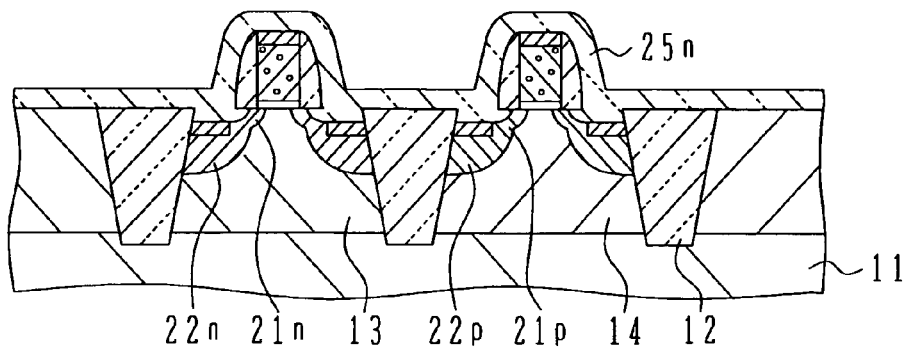
Figure 2K:
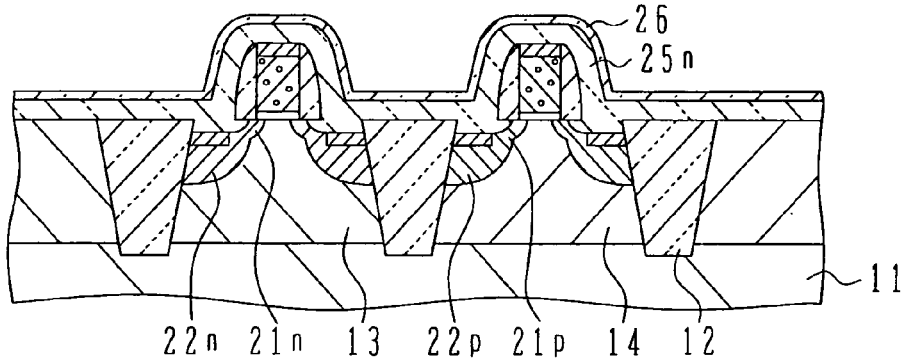
Figure 2L:
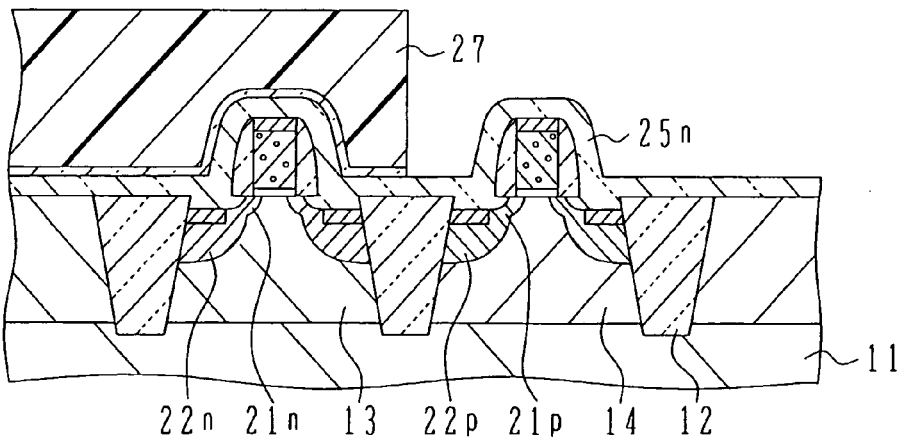
Figure 2M:
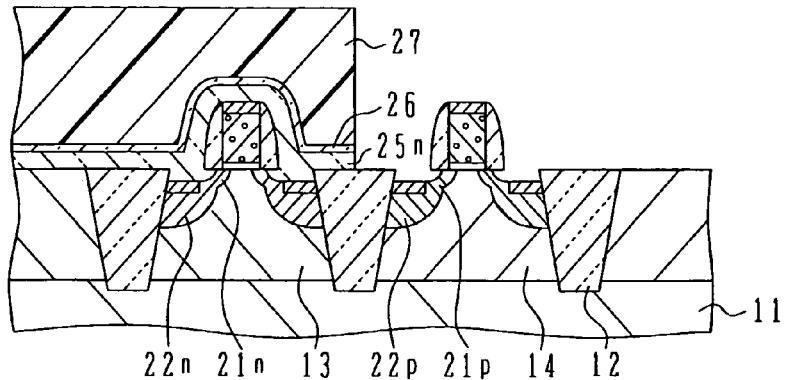
Figure 2N:
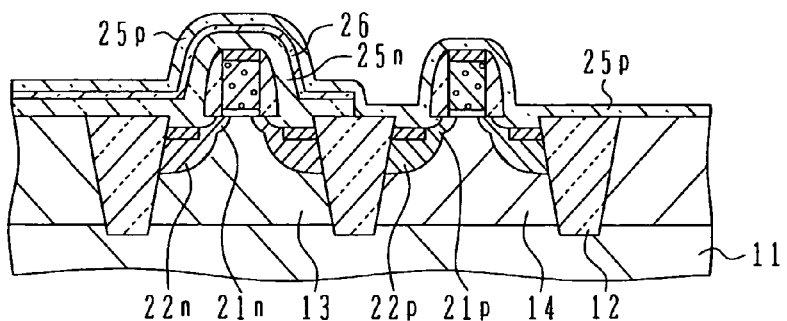
Figure 2O:
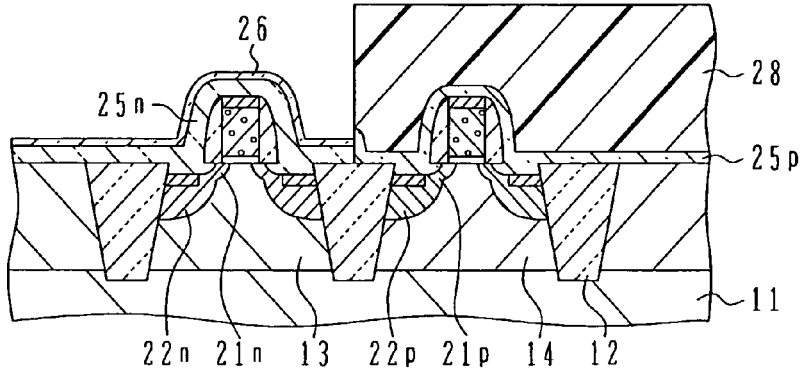
Figure 2P:
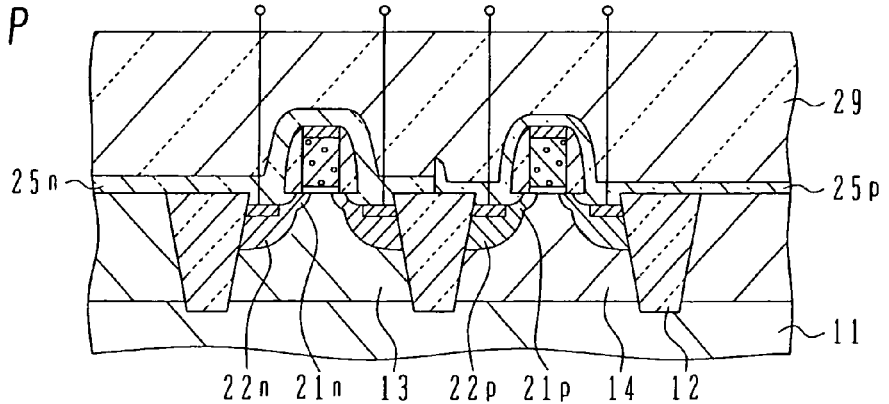

FIGS. 2A to 2P are cross sectional views illustrating manufacture processes for the semiconductor device described above.

As shown in FIG. 2A, a shallow trench defining active regions is formed in the surface layer of a p-type silicon substrate 11, and an insulating film is deposited to bury the trench. An unnecessary insulating film on the active region is removed by chemical mechanical polishing (CMP) or the like to form a shallow trench isolation (STI) region 12. Regions where n- and p-channel MOSFETs are formed are separated by resist masks and impurity ions are implanted into these regions to form a p-type well 13 and an n-type well 14.

As shown in FIG. 2B, the surfaces of the active regions are thermally oxidized and then nitridated to form a silicon oxynitride film 15 having a thickness of 1.2 nm as a gate insulating film. In addition to the silicon oxynitride film, the gate insulating film may be made of a lamination of a silicon oxide film and a silicon nitride film or a lamination of an oxide film and a high-k film such as $HfO_2$ formed thereon.

As shown in FIG. 2C, a polysilicon layer G having a thickness of, e.g., 140 nm and a cap silicon oxide layer 16 having a thickness of, e.g., about 50 nm are stacked on the gate insulating film 15. A photoresist pattern PR1 is formed on the silicon oxide layer 16, and the silicon oxide layer 16, polysilicon layer G and gate insulating film 15 are patterned. The photoresist pattern PR1 is used as the mask when the silicon oxide layer 16 is etched, and thereafter, by using the silicon oxide layer 16 as a mask, the polysilicon layer G and gate insulating film 15 are patterned. If the photoresist pattern PR1 is left, this pattern is removed. An insulated gate electrode structure is therefore formed.

As shown in FIG. 2D, the n-type well 14 is covered with a resist pattern, and by using the insulated gate structure as a mask, n-type impurities, e.g., As, are implanted into the p-type well 13 under the conditions of an acceleration energy of 2 keV and a dose of $5 \times 10^{14}$, to form n-type shallow extension regions 21n on both sides of the insulated gate structure. The p-type well 13 is covered with a resist pattern, and by using the insulated gate structure as a mask, p-type impurities, e.g., B, are implanted into the n-type well 14 under the conditions of an acceleration energy of 1 keV and a dose of $4 \times 10^{14}$, to form p-type shallow extension regions 21p on both sides of the insulated gate structure. Implanted ions are activated to form extension regions 21n and 21p having a depth of about 30 nm. The extension regions slightly creep under the insulated gate electrode structure. This shape is intended to be covered by the sentence that the extension regions are formed "on both sides of the insulated gate electrode structure".

As shown in FIG. 2E, a silicon oxide layer having a thickness of about 80 nm is deposited on the surface of the silicon substrate, for example, by CVD, and reactive ion etching (RIE) is performed to leave side wall spacers SW only on the side walls of the gate electrode.

As shown in FIG. 2F, over-etching is performed until the oxide film 16 on the gate G is removed. For example, by using $C_xH_yF_z$ as etchant, etching is performed at a low selection ratio between the oxide film and silicon, by using the side wall spacers SW as a mask, to form shallow recesses 17 in the surface layer of the silicon substrate. For example, the recess 17 has a depth of 1 to 10 nm and the side wall spacer width is 70 nm. The recesses are formed on both regions outside of the side wall spacers SW.

As shown in FIG. 2G, after reactive ion etching, wet etching of HCl for example is performed to isotropically etch the silicon substrate surface and form recesses 18 creeping under the side wall spacers SW by 1 to 20 nm. A depth of the recess 18 from the substrate surface is set to, for example, 1 to 20 nm. The recesses 18 in the regions outside of the side wall spacers SW creep under the sidewall spacers SW.

The cap silicon oxide film 16 may be omitted. Instead of a combination of reactive etching and isotropic etching, it is expected that the recesses having the regions creeping under the side wall spacers can be formed by performing only isotropic etching after the substrate surface is exposed.

As shown in FIG. 2H, the n-type well 14 where a p-channel MOSFET is formed is covered with a mask, and n-type impurities, e.g., P are implanted in to the region where an n-channel MOSFET is formed, under the conditions of an acceleration energy of 10 keV and a dose of $4 \times 10^{15}$, to form n-type source/drain diffusion layers 22n. The n-type impurities are also doped in the gate electrode while the source/drain diffusion regions are formed outside of the side wall spacers SW and insulated gate electrode structure. The source/drain diffusion layers have the regions creeping under the side wall spacers. This shape is intended to be covered by the sentence that the source/drain diffusion layers are formed "outside of the side wall spacers".

The region where an n-channel MOSFET is formed is covered with a mask, and p-type impurities, e.g., B are implanted into the region where a p-channel MOSFET is formed, under the conditions of an acceleration energy of 6 keV and a dose of $4 \times 10^{15}$, to form p-type source/drain diffusion layers 22$p$. The p-type impurities are also doped in the gate electrode while the source/drain diffusion layers are formed.

The side wall spacer SW has a desired width and the source/drain diffusion regions formed by using the side wall spacers as a mask have also a desired space therebetween. The short channel effect can therefore be suppressed.

Although the source/drain layers are formed after the recesses are formed, the recesses may be formed after the source/drain layers are formed. If isotropic etching having different etching rates for n- and p-type silicon is used, the lengths of the recesses creeping under the side wall spacers SW become different between n- and p-channel MOSFETs.

As shown in FIG. 2I, a Co film is deposited, for example, by sputtering from a higher position to conduct a primary silicidation reaction and thereafter, an unreacted unnecessary metal layer is washed out, and a secondary silicidation reaction is performed to form a low resistance silicide layers SL. The silicide layer is not an essential constituent element.

As shown in FIG. 2J, a nitride film 25$n$ having a high tensile stress is deposited by thermal CVD, for example, under the following conditions. As the silicon source gas, a mixed gas of dichlorsilane (DCS), silane ($SiH_4$), $Si_2H_4$ and disilane ($Si_2H_6$) is flowed at 5 to 50 sccm, and as the nitrogen source gas, $NH_3$ is flowed at 500 to 10000 sccm and a mixed gas f $N_2$ and Ar is flowed at 500 to 10000 sccm, respectively at a pressure of 0.1 to 400 torr and a temperature of 500 to 700° C., to thereby form the nitride film having a thickness of, e.g., 80 nm. As the nitride film having a high tensile stress is formed burying the recess regions, a high tensile stress is applied to the channel region and a large strain is generated.

As shown in FIG. 2K, on the nitride film 25$n$, an oxide film having a thickness of, e.g., 10 nm is formed by TEOS or the like. The oxide film 26 can be formed by various methods if the film provides a buffer function.

As shown in FIG. 2L, the region where the n-channel MOSFET is formed is covered with a resist mask 27, and the exposed oxide film 26 is removed by RIE using as an etchant gas, for example, $C_4F_8/Ar/O_2$.

As shown in FIG. 2M, by using the same resist mask 27, the nitride film 25$n$ exposed by RIE is etched and removed by changing the etching gas, for example, to $CHF_3Ar/O_2$. The resist mask 27 is thereafter removed. The p-channel MOSFET structure is exposed.

As shown in FIG. 2N, a nitride film 25$p$ having a high compressive stress is formed by plasma CVD, for example, under the following conditions. As the source gas, for example, $SiH_4$ at 100 to 1000 sccm, $NH_3$ at 500 to 10000 sccm, and $N_2$ or Ar at 500 to 10000 sccm are flowed at a pressure of 0.1 to 400 torr, a temperature of 500 to 700° C. and an RF power of 100 to 1000 W to perform plasma CVD. As the nitride film having a high compressive stress is formed burying the recess regions, a high compressive stress is applied to the channel region and a large strain is generated.

As shown in FIG. 2O, the p-channel MOSFET region is covered with a resist mask 28, the nitride film 25$p$ having the high compressive stress in the n-channel MOSFET region is etched and removed. During this etching, the oxide film 26 can be used as an etching stopper. For example, the nitride film is etched by RIE using as etchant $CHF_3/Ar/O_2$. Next, the exposed oxide film 26 is removed by RIE using as etchant $C_4F_8/Ar/O_2$. The resist mask 28 is thereafter removed.

The nitride film having the high tensile stress is formed first and selectively removed, and then the nitride film having a high compressive stress is formed. The order of forming the nitride films may be reversed. Although the nitride film having the opposite polarity stress formed on the nitride film with a desired stress is removed, this nitride film may be left as it is although the advantageous effects are slightly reduced.

As shown in FIG. 2P, by using a TEOS oxide film or high density plasma (HDP) oxide film, an oxide film 29 is deposited on the nitride films 25$n$ and 25$p$. The nitride film 25 and oxide film 29 constitute the interlayer insulating film. Thereafter contact holes are formed through the interlayer insulating film to lead source/drain electrodes and the like.

After the recess regions are formed outside of the side wall spacers, the nitride film is formed burying the recess regions. Accordingly, a high stress can be applied to the channel region and the characteristics of MOSFETs can be improved, without narrowing the side wall spacer width and without setting the thickness of the nitride film too thick.

In the embodiment described above, the n-channel MOSFET is covered with a nitride having a tensile stress, whereas the p-channel MOSFET is covered with a nitride film having a compressive stress. The characteristics of both n- and p-channel MOSFETs can therefore be improved by stress.

This embodiment uses a process of removing the nitride film once formed, depositing a new nitride film and removing unnecessary portions. A simplified process is desired which can maintain the embodiment advantageous effects to some degree.

FIGS. 3A to 3G are cross sectional views illustrating a CMOS semiconductor device manufacture method according to the second embodiment, the method using a simplified process. First, by using the processes shown in FIGS. 2A to 2E, the insulated gate electrode structure, side wall spacers and extension regions are formed.

Figure 3A:
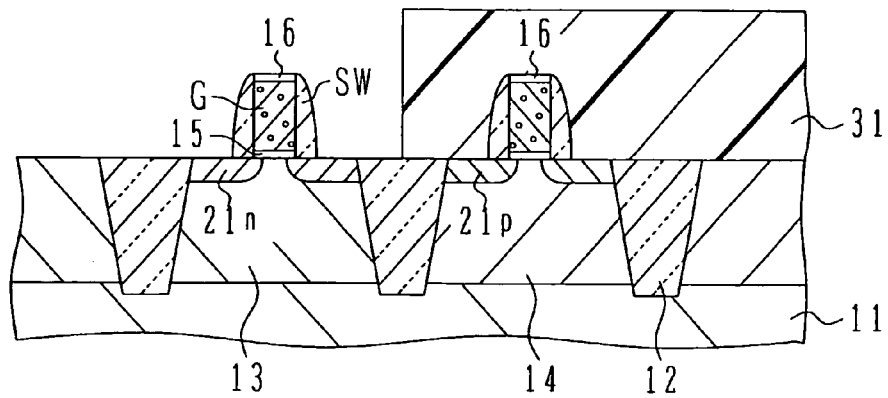
FIGS. 3A to 3G are cross sectional views illustrating a semiconductor device manufacture method according to a second embodiment.

As shown in FIG. 3A, a photoresist mask 31 is formed covering a p-channel MOSFET region and exposing an n-channel MOSFET region in an opening of the photoresist mask 31.

Figure 3B:
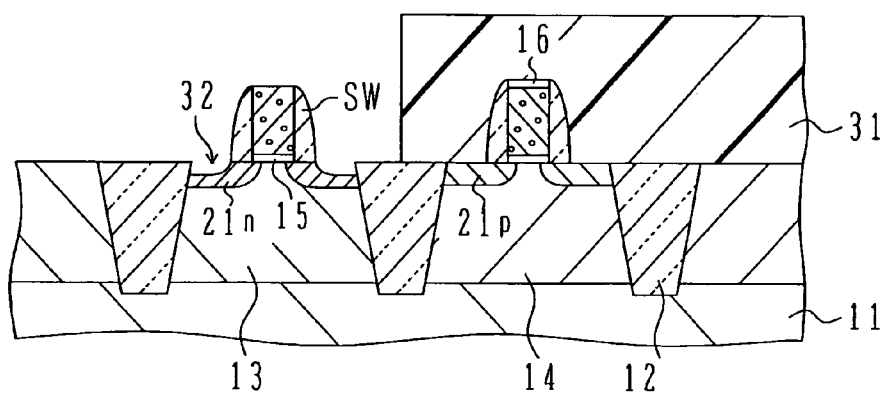

As shown in FIG. 3B, in the state that the p-channel MOSFET region is covered with the photoresist mask 31, similar to the process shown in FIG. 2F, RIE is performed to form recess regions 32 only in the n-channel MOSFET region, the recess regions being formed by digging the silicon substrate outside of the side wall spacers from the surfaces of the substrate.

Figure 3C:
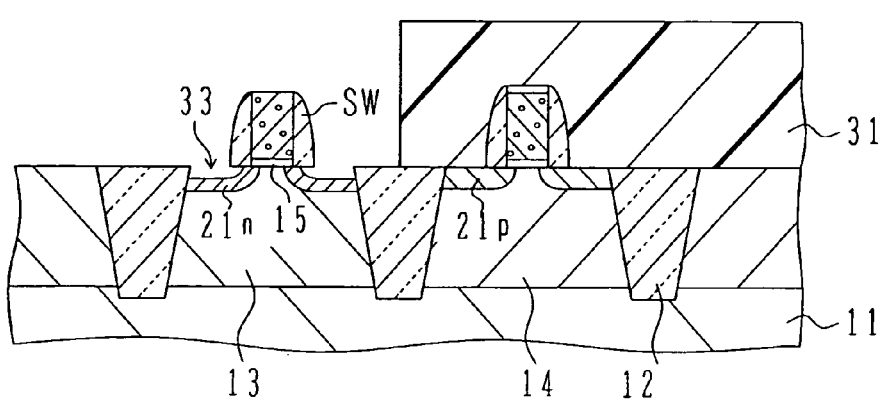

As shown in FIG. 3C, similar to the process shown in FIG. 2G, isotropic etching such as wet etching using HCl is performed to form recess regions 33 only in the n-channel MOSFET region, the recess regions creeping under the side wall spacers SW. The photoresist mask 31 is thereafter removed and a cap silicon oxide film 16 in the p-channel MOSFET region is removed.

Figure 3D:
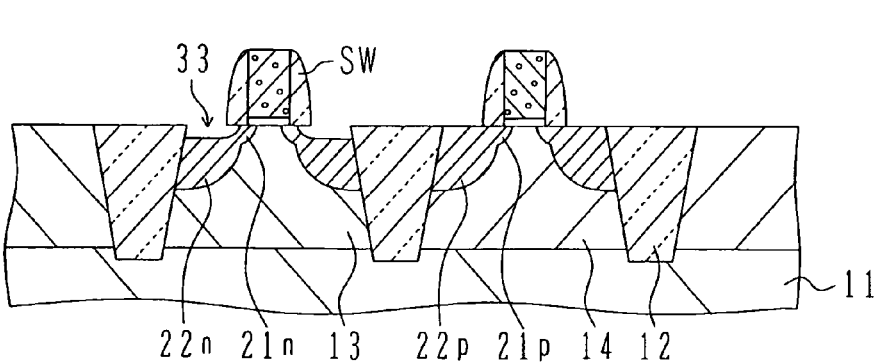

As shown in FIG. 3D, different ion implantation processes are performed for n- and p-channel MOSFETs to form source/drain diffusion layers 22$n$ and 22$p$. In this case, the gate electrodes are also doped. As shown in FIG. 3D, although the recess regions 33 are formed in the n-channel MOSFET, recess regions are not formed in the p-channel MOSFET.

Figure 3E:
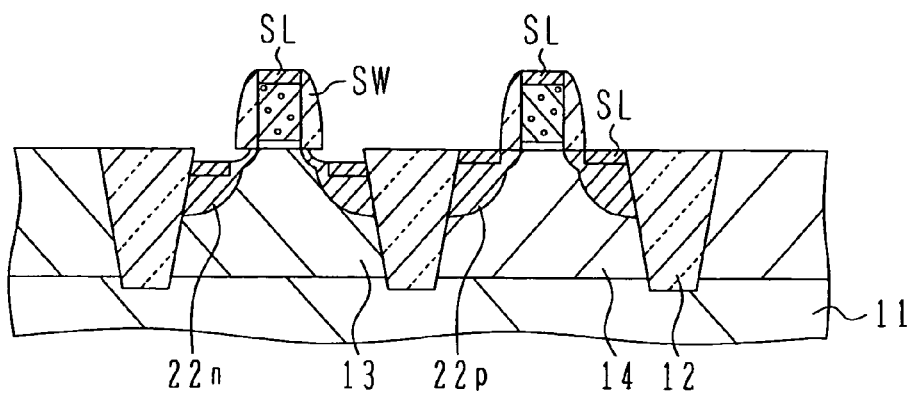

As shown in FIG. 3E, similar to the process shown in FIG. 2I, a silicidation process is performed to form silicide regions on the silicon surface. This silicidation process is not an essential process.

Figure 3F:
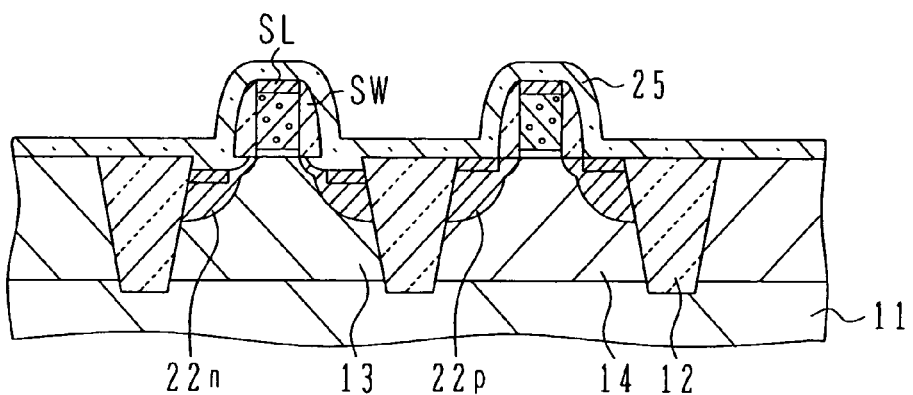

As shown in FIG. 3F, a nitride film 25 having a high tensile stress is deposited on the substrate surface. Since the n-channel MOSFET has the recess regions, a high tensile stress is applied to the channel region and a large strain is generated. Since the recess regions are not formed in the p-channel MOSFET, the nitride film 25 having a tensile stress applies a small stress to the channel region. As compared to the case wherein the recess regions are formed, the performance of the p-channel MOSFET is suppressed from being degraded.

Figure 3G:
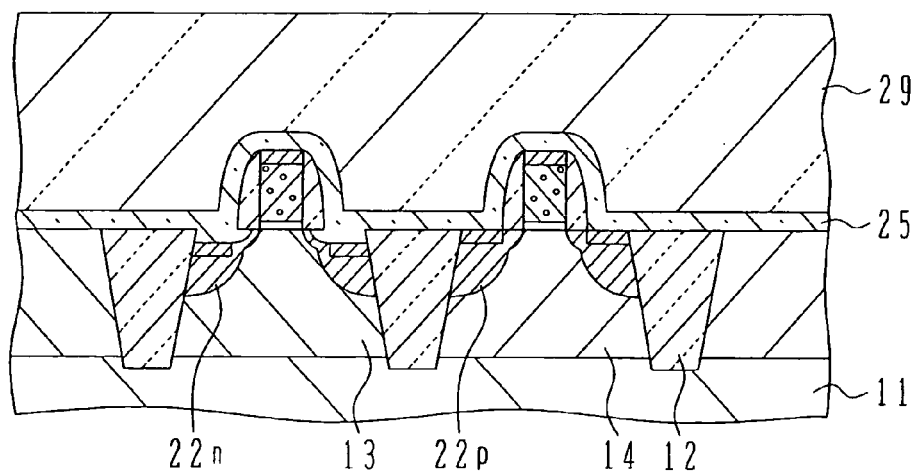

As shown in FIG. 3G, an oxide film 29 is formed on the nitride film 25 to complete an interlayer insulating film. Similar to the first embodiment, the n-channel MOSFET receives a large tensile stress so that the performance thereof can be improved. Although the performance of the p-channel MOSFET is degraded by the tensile stress, since the recess regions are not formed, degradation can be suppressed. The n-channel MOSFET having a performance improved by stress can be formed by a simplified process.

The present invention has been described in connection with the preferred embodiments. The invention is not limited only to the above embodiments. It will be apparent to those skilled in the art that other various modifications, improvements, combinations, and the like can be made.

What we claim are:

1. A semiconductor device comprising:
    a semiconductor substrate having a plurality of active regions including a p-type active region;
    an insulated gate electrode structure formed on each of said active regions, said insulated gate electrode structure having a gate insulating film and a gate electrode formed thereon;
    side wall spacers formed on side walls of each of said insulated gate electrode structures;
    source/drain regions having extension regions having a conductivity type opposite to a conductivity type of each of said active regions and formed in said active regions on both sides of each of said insulated gate electrode structures and source/drain diffusion layers having the conductivity type opposite to the conductivity type of each of said active regions and formed in said active regions outside of said side wall spacers, n-type source/drain regions being formed in said p-type active region;
    first recess regions formed in said n-type source/drain region, said first recess regions having regions creeping under said side wall spacers at a level below said gate insulating film; and
    a first nitride film having a tensile stress formed covering said p-type active region and burying said first recess regions.

2. A semiconductor device according to claim 1, wherein a length of the region of said first recess region creeping under said adjacent side wall spacer is 1 nm to 20 nm.

3. A semiconductor device according to claim 1, wherein said plurality of active regions include also an n-type active region, and the semiconductor device further comprises:
    second recess regions formed in a p-type source/drain regions in said n-type active regions; and
    a second nitride film having a compressive stress formed covering said n-type active region and burying said second recess regions.

4. A semiconductor device according to claim 3, wherein said first and second recesses have regions creeping under adjacent one of said side wall spacers.

5. A semiconductor device according to claim 4, wherein a length of said region creeping under said side wall spacer is 1 nm to 20 nm.

6. A semiconductor device according to claim 4, wherein lengths of said regions creeping under said side wall spacers are different.

7. A semiconductor device according to claim 1, wherein a depth of said first recess region is shallower than a depth of said extension region.

8. A semiconductor device according to claim 7, wherein the depth of said first recess region is in a range from 1 nm to 20 nm.

9. A semiconductor device according to claim 1, wherein said plurality of active regions include also an n-type active region, said n-type active region has no recess region, and said first nitride film covers also said n-type active region.

10. A semiconductor device according to claim 9, wherein said first recess region has a region creeping under adjacent one of said side wall spacers.

11. A semiconductor device comprising:
    a semiconductor substrate having a plurality of active regions including a p-type active region;
    an insulated gate electrode structure formed on each of said active regions, said insulated gate electrode structure having a gate insulating film and a gate electrode formed thereon;
    side wall spacers formed on side walls of each of said insulated gate electrode structures;
    source/drain regions having extension regions having a conductivity type opposite to a conductivity type of each of said active regions and formed in said active regions on both sides of each of said insulated gate electrode structures and source/drain diffusion regions having the conductivity type opposite to the conductivity type of each of said active regions and formed in said active regions outside of said side wall spacers, an n-type source/drain region being formed in said p-type active region;
    first recess regions formed by removing upper portions of said n-type source/drain regions, the first recess regions being aligned to associated ones of said side wall spacers, the first recess regions having regions creeping under said side wall spacers at a level below said gate insulating film; and
    a first nitride film having a tensile stress formed covering said p-type active region and burying said first recess regions.

12. A semiconductor device according to claim 11, wherein said plurality of active regions include also an n-type active region, p-type source/drain regions being formed in said n-type active region, and the semiconductor device further comprises:
    second recess regions formed by removing upper portions of said source/drain regions, the second recess regions being aligned to associated ones of said side wall spacers; and
    a second nitride film having a compressive stress formed covering said n-type active region and burying said second recess regions.

13. A semiconductor device comprising:
a semiconductor substrate having a plurality of active regions including a p-type active region;
an insulated gate electrode structure formed on each of said active regions, said insulated gate electrode structure having a gate insulating film and a gate electrode formed thereon;
side wall spacers formed on side walls of each of said insulated gate electrode structures;
source/drain regions having extension regions having a conductivity type opposite to a conductivity type of each of said active regions and formed in said active regions on both sides of each of said insulated gate electrode structures and source/drain diffusion regions having the conductivity type opposite to the conductivity type of each of said active regions and formed in said active regions outside of said side wall spacers, an n-type source/drain region being formed in said p-type active region;
first recess regions formed by removing upper portions of said n-type source/drain regions, the first recess regions being horizontally separated from associated one of the gate electrodes, said first recess regions having regions creepin under said side wall spacers at a level below said gate insulating film; and
a first nitride film having a tensile stress formed covering said p-type active region and burying said first recess regions.

14. A semiconductor device according to claim 13, wherein said plurality of active regions include also an n-type active region, p-type source/drain regions being formed in said n-type active region, and the semiconductor device further comprises:
second recess regions formed by removing upper portions of said source/drain regions, the second recess regions being horizontally separated from associated one of the gate electrodes; and
a second nitride film having a compressive stress formed covering said n-type active region and buying said second recess regions.

* * * * *